(12) United States Patent
Hyun

(10) Patent No.: US 7,759,232 B2
(45) Date of Patent: Jul. 20, 2010

(54) METHOD OF FORMING DAMASCENE PATTERNS OF SEMICONDUCTOR DEVICES

(75) Inventor: Chan Sun Hyun, Icheon-si (KR)

(73) Assignee: Hynix Semiconductor Inc., Gyeonggi-Do (KR)

( * ) Notice: Subject to any disclaimer, the term of this patent is extended or adjusted under 35 U.S.C. 154(b) by 0 days.

(21) Appl. No.: 12/344,444

(22) Filed: Dec. 26, 2008

(65) Prior Publication Data

US 2009/0186486 A1 Jul. 23, 2009

(30) Foreign Application Priority Data

Jan. 21, 2008 (KR) .................... 10-2008-0006152

(51) Int. Cl.
*H01L 21/20* (2006.01)

(52) U.S. Cl. .............. 438/584; 438/637; 438/619; 438/693; 438/689; 257/315; 257/777; 257/758

(58) Field of Classification Search ............ 438/584, 438/689, 637, 619, 693; 257/315, 758, 777
See application file for complete search history.

(56) References Cited

U.S. PATENT DOCUMENTS 6,194,128 B1 * 2/2001 Tao et al. .................... 430/313

2006/0113547 A1 * 6/2006 Shin .............................. 257/77
2008/0087932 A1 * 4/2008 Son et al. .................... 257/315

FOREIGN PATENT DOCUMENTS

KR 1020060020918 3/2006
KR 1020060039571 5/2006

OTHER PUBLICATIONS

Office Action dated Jul. 22, 2009, for Korean application No. 10-2005-0006152.

* cited by examiner

*Primary Examiner*—Matthew Smith
*Assistant Examiner*—Wilner Jean Baptiste
(74) *Attorney, Agent, or Firm*—Lowe Hauptman Ham & Berner LLP

(57) ABSTRACT

A method of forming damascene patterns of semiconductor devices comprise forming a first insulating layer and contact plugs, formed in the first insulating layer, over a semiconductor substrate, forming an etch barrier layer and a second insulating layer over the first insulating layer, forming damascene patterns in the second insulating layer, forming a mask layer over the second insulating layer of other region except a region in which the contact plugs are formed so that the damascene patterns are exposed through the region in which the contact plugs are formed, removing the etch barrier layer under the exposed damascene patterns using an etching process employing the mask layer, and removing the mask layer.

6 Claims, 5 Drawing Sheets

METHOD OF FORMING DAMASCENE PATTERNS OF SEMICONDUCTOR DEVICES

CROSS-REFERENCES TO RELATED APPLICATION

The present application claims priority to Korean patent application number 10-2008-0006152, filed on Jan. 21, 2008, which is incorporated by reference in its entirety.

BACKGROUND OF THE INVENTION

The present invention relates to a method of forming damascene patterns of semiconductor devices and, more particularly, to a method of forming damascene patterns of semiconductor devices, which is capable of forming damascene patterns having a uniform depth.

Semiconductor memory devices are classified into volatile memory in which data is lost when power is off and nonvolatile memory in which data can be retained although power is off.

Nonvolatile memory may include Erasable Programmable Read Only Memory (EPROM), Electrically Erasable Programmable Read Only Memory (EEPROM), flash memory, and so on.

Flash memory among the nonvolatile memory devices refers to devices in which data can be retained although power is off and which can be electrically programmed and erased without a refresh function of rewriting data at specific intervals. Here, the terminology 'program' refers to an operation of writing data into memory cells, and the terminology 'erase' refers to an operation of erasing data written into memory cell.

The flash memory devices are divided into NOR type flash memory devices and NAND type flash memory device depending on a structure and operating conditions of a cell. In the NOR type flash memory devices, a drain of each of memory cell transistors is connected to bit lines, thus enabling program and erase for a specific address. Accordingly, the NOR type flash memory devices are generally used for applications requiring a high-speed operation because the operating speed is fast. In contrast, in the NAND type flash memory devices, a plurality of memory cell transistors is connected in series, constituting one string, and one string is coupled between bit lines and a common source line. Thus, the NAND type flash memory device has a relatively small number of drain contact plugs, thus facilitating the higher integration. Accordingly, the NAND type flash memory devices are generally used for applications requiring high-capacity data retention.

Each of the NAND type flash memory devices includes a plurality of word lines formed between a source select line and a drain select line. Select lines may include, for example, source select lines or drain select lines. A junction is formed between each of the select lines and each of the word lines. A junction between the source select lines is a common source region, and a junction between the drain select lines is a drain region.

Typically, a gate and a drain region are electrically brought in contact with the outside through contact holes, but a common source region is electrically brought in contact with the outside through a common source line having a line structure. Accordingly, the common source line occupies a large area in a flash memory device. In order to improve the performance of a flash memory device, many attempts are made to decrease the sheet resistance of the common source line. This becomes a more important issue as semiconductor devices gradually reduce in size and have higher integration.

BRIEF SUMMARY OF THE INVENTION

According to the present invention, an etch barrier layer and a second insulating layer having damascene patterns formed therein are formed over a first insulating layer in which contact plugs are formed. A mask layer is formed over the damascene patterns in which contact plugs are not formed. An etch barrier layer of regions in which the respective contact plugs are formed is then removed. Accordingly, since the damascene patterns in which the contact plugs are not formed are not exposed during an etching process, the damascene patterns can maintain a uniform depth.

According to a method of forming damascene patterns of semiconductor devices in accordance with an aspect of the present invention, a first insulating layer and contact plugs, formed in the first insulating layer, are first formed over a semiconductor substrate. An etch barrier layer and a second insulating layer are formed over the first insulating layer. Damascene patterns are formed in the second insulating layer. A mask layer is formed over the second insulating layer of other region except a region in which the contact plugs are formed. Here, the damascene patterns are exposed through the regions in which the contact plugs are formed. The etch barrier layer under the exposed damascene patterns are removed using an etching process employing the mask layer. The mask layer is then removed.

The etch barrier layer may be formed from materials having an etch selectivity different from that of the second insulating layer. The etch barrier layer may be formed from a nitride layer. The second insulating layer may be formed from an oxide layer. The removal of the etch barrier layer may be performed using any one of a $CF_4$ gas, a $CHF_3$ gas, and a $CH_2F_2$ gas or a mixed gas of two or more of them. The etch barrier layer may remain under the damascene patterns of the region in which the contact plugs are not formed.

According to the present invention, damascene patterns, formed in a region in which contact plugs are not formed, can have their original uniform depths. Accordingly, metal lines formed in the respective damascene patterns can have the same height and minimize a variation in the resistance according to the metal lines. Further, the metal lines formed in the respective damascene patterns of the region in which the contact plugs are not formed are formed in an insulating layer having lower capacitance than that of an etch barrier layer. Accordingly, since capacitance between the metal lines decreases and RC delay is improved, the characteristics of semiconductor devices can be improved.

DESCRIPTION OF SPECIFIC EMBODIMENT

Figure 1A:
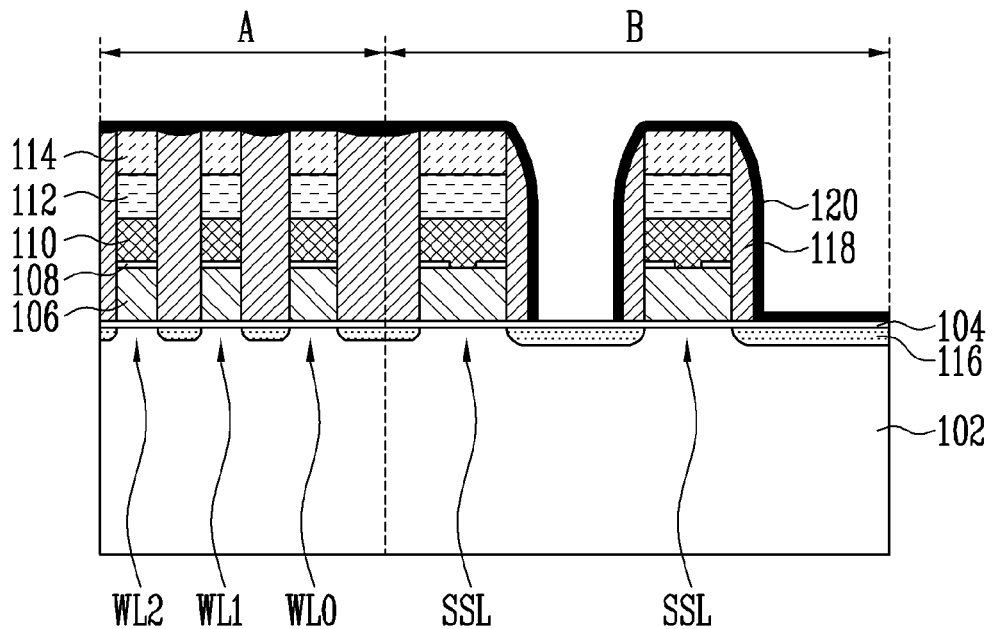
FIGS. 1A to 1F are sectional views showing a method of forming damascene patterns of semiconductor devices according to the present invention.

Hereinafter, the present invention will be described in detail in connection with a specific embodiment with reference to the accompanying drawings. The present embodiment is provided to complete the disclosure of the present invention and to allow those having ordinary skill in the art to understand the scope of the present invention. When it is said that any part, such as a layer, film, area, or plate, is positioned on another part, it means the part is directly on the other part or above the other part with at least one intermediate part. To clarify multiple layers and regions, the thickness of the layers is enlarged in the drawings.

FIGS. 1A to 1F are sectional views showing a method of forming damascene patterns of semiconductor devices according to the present invention.

Referring to FIG. 1A, there is provided a semiconductor substrate 102, including regions in which contact plugs are not formed (reference numeral A) and regions in which contact plugs are formed (reference numeral B). A plurality of source select lines SSL, a plurality of word lines WL0, WL1, WL2, . . . , and a plurality of drain select lines DSL (not shown), as gates, are formed in parallel at specific intervals on the semiconductor substrate 102. Although 16, 32 or 64 word lines are generally formed between the source select lines SSL and the drain select lines DSL, only three word lines WL0, WL1, and WL2 are shown in the drawings, for convenience of description. The source select lines SSL and the drain select lines DSL are hereinafter referred to as 'select lines' when they are together called.

Each of the word lines WL0, WL1, WL2, . . . , or the select lines SSL or DSL has a stack layer structure, including a gate insulating layer 104, a conductive layer 106 for a floating gate, a dielectric layer 108, a conductive layer 110 for a control gate, a gate electrode layer 112, and a hard mask pattern 114. Preferably, the conductive layer 106 for a floating gate and the conductive layer 110 for a control gate may be formed from polysilicon, and the dielectric layer 108 may have an Oxide/Nitride/Oxide (ONO) structure in which an oxide layer, a nitride layer, and an oxide layer are stacked. The gate electrode layer 112 may be formed from tungsten silicide (WSix), that is, conductive materials generally used in a semiconductor fabrication process. Further, the conductive layer 106 for a floating gate and the conductive layer 110 for a control gate of the select lines SSL or DSL are electrically interconnected through a specific process.

Further, an ion implantation process is performed on the semiconductor substrate 102 exposed between the select lines SSL or DSL and the word lines WL0, WL1, WL2, . . . , thus forming a plurality of junctions 116. Here, the junction 116 formed between the source select lines SSL becomes a common source region, and a junction (not shown) formed between the drain select lines DSL becomes a drain region.

Next, an insulating layer 118 is formed over the semiconductor substrate 102, including the word lines WL0, WL1, WL2, . . . , and the select lines SSL or DSL. An anisotropic etching process is performed on the insulating layer 118. Accordingly, the insulating layer 118 remains between the respective word lines WL0, WL1, WL2, . . . , each having a narrow width. Further, the insulating layer 118 remaining on sidewalls of the select lines SSL or DSL in spacer form, and the common source region or the drain region is exposed between the remaining sidewalls.

Next, a passivation layer 120 is formed on the entire surface of the semiconductor substrate 102, including the word lines WL0, WL1, WL2, . . . , the select lines SSL or DSL, and the insulating layer 118. The passivation layer 120 is used for a Self-Aligned Contact (SAC) process, which is performed to prevent the sidewalls of the select lines SSL or DSL from being damaged even although alignment error occurs when contact holes are formed between the select lines SSL or DSL in a subsequent process. The passivation layer 118 is preferably formed from a nitride layer, and is preferably formed in a thin thickness so that gate stack layers, formed by the above-described process, can maintain their step.

Figure 1B:
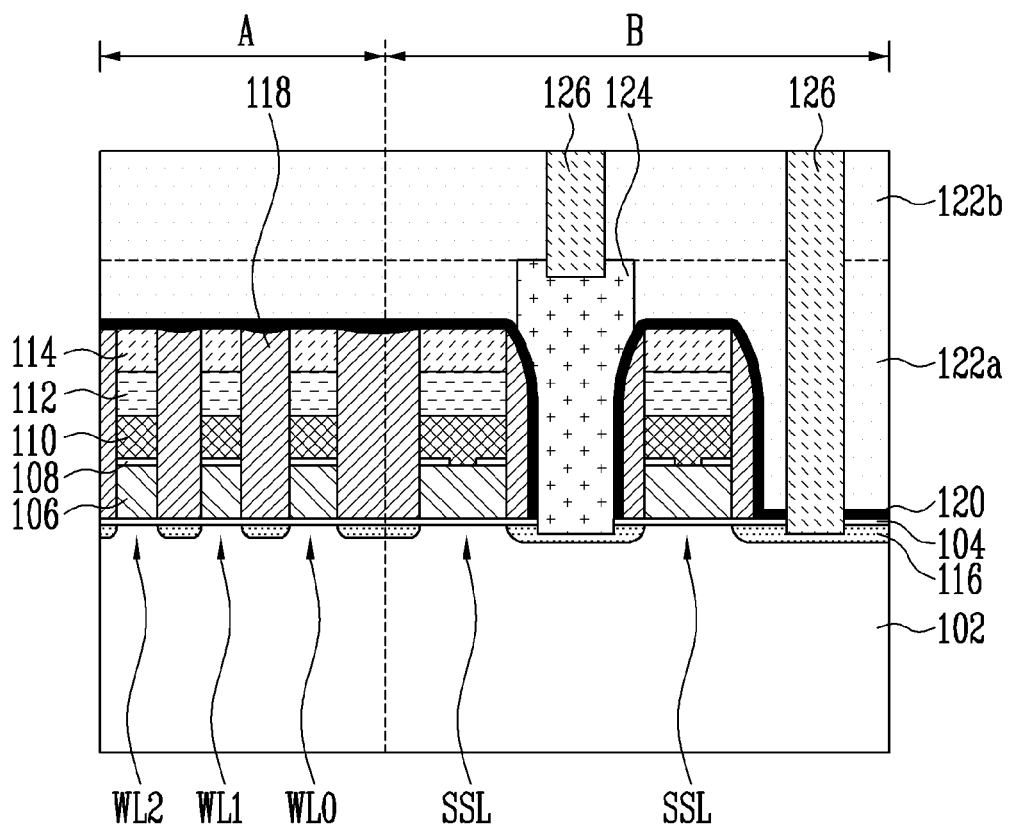

Referring to FIG. 1B, a first pre-metal dielectric layer 122a is formed over the semiconductor substrate 102, including the select lines SSL or DSL and the word lines WL0, WL1, WL2, . . . . Next, a contact hole is formed by etching the first pre-metal dielectric layer 122a so that the common source region between the source select lines SSL is exposed. Next, a conductive material (for example, tungsten) is formed in the contact hole. The conductive material formed on the first pre-metal dielectric layer 122a is removed using a Chemical Mechanical Polishing (CMP) method, so a first contact plug 124 is formed in the contact hole.

A second pre-metal dielectric layer 122b is then formed on the first pre-metal dielectric layer 122a including the first contact plug 124. Next, contact holes are formed by etching the second pre-metal dielectric layer 122b and the first pre-metal dielectric layer 122a so that the first contact plug 124 and the junction between the source select lines SSL or a drain region (not shown) between the drain select lines DSL are exposed. A conductive material (for example, tungsten) is formed in the contact holes, and a plurality of second contact plugs 126 is formed in the respective contact holes by removing the conductive material, formed on the second pre-metal dielectric layer 122b, using a CMP method. The second contact plugs 126 may be coupled to the first contact plug 124, and the junction between the source select lines SSL or the drain region (not shown) between the drain select lines DSL. Accordingly, the plurality of contact plugs 124 and 126 is formed in the second area B of the semiconductor substrate 102, in which the select lines SSL or DSL are formed.

Figure 1C:
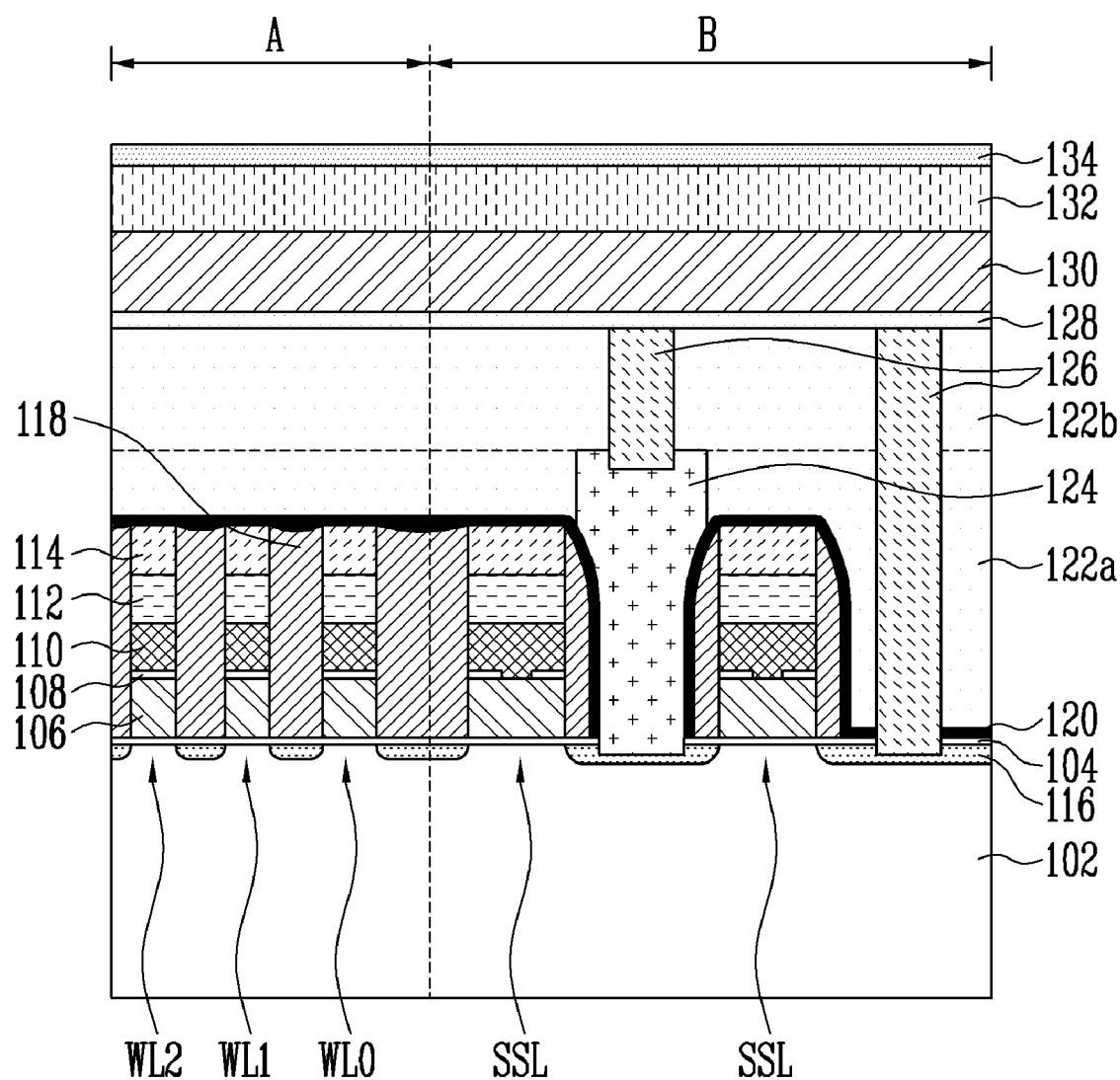

Referring to FIG. 1C, an etch barrier layer 128, a trench insulating layer 130, a first hard mask layer 132, and a second hard mask layer 134 are formed over the second pre-metal dielectric layer 122b in order to form metal lines coupled to the respective second contact plugs 126.

The etch barrier layer 128 is used to form damascene patterns, having a uniform depth, in a subsequent etching process of the trench insulating layer 130. The etch barrier layer 128 may be formed from materials (for example, a nitride layer), having an etch selectivity different from that of the trench insulating layer 13, to a thickness of 200 to 300 Å. The trench insulating layer 130 is a layer in which damascene patterns (for example, trenches or via holes) for forming metal lines are formed, and may be formed from an oxide layer to a thickness of 1000 to 1500 Å. The first hard mask layer 132 may be formed from an amorphous carbon layer to a thickness of 1500 to 2500 Å, and the second hard mask layer 134 may be formed from a SiON layer to a thickness of 300 to 500 Å.

Figure 1D:
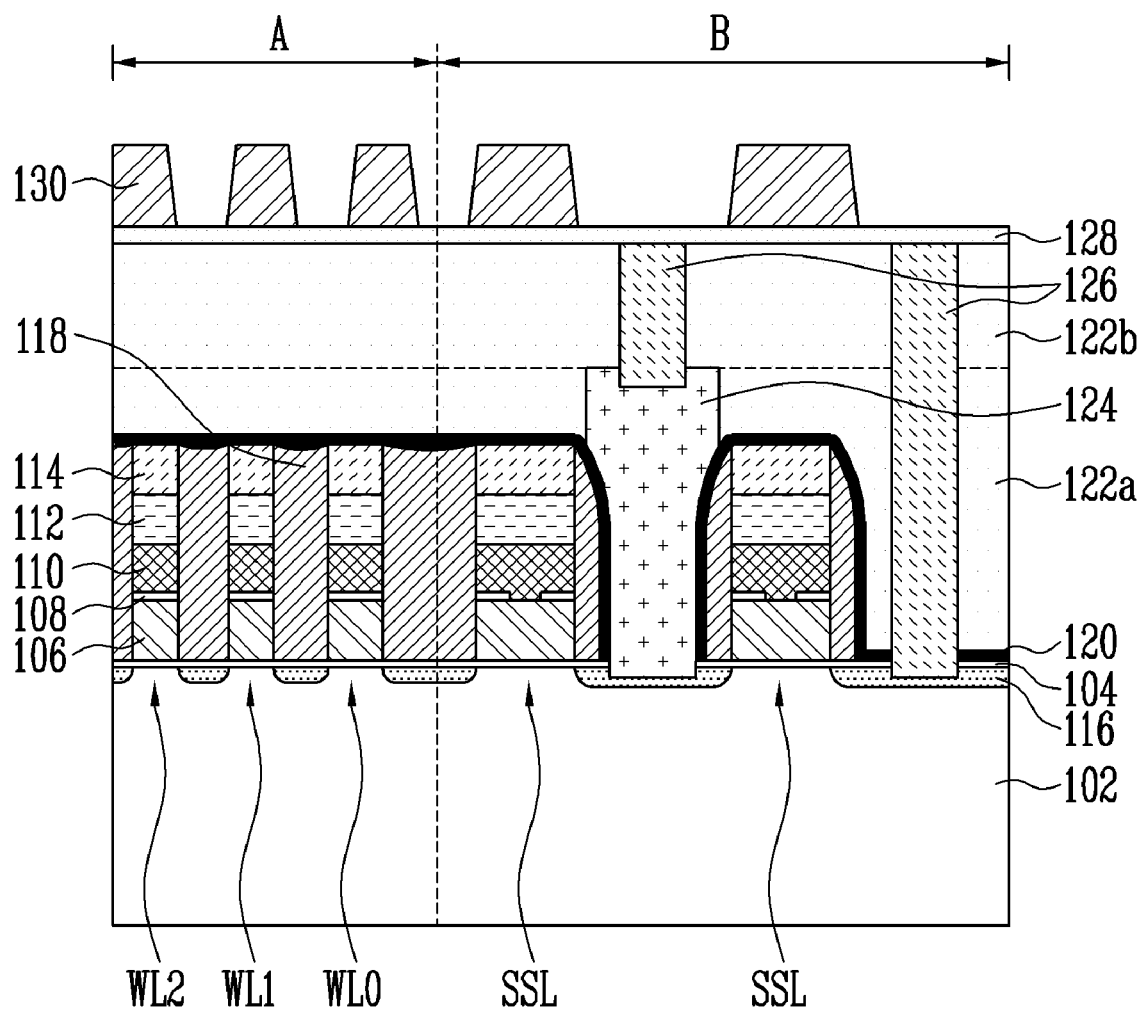

Referring to FIG. 1D, a photoresist pattern (not shown) through which regions in which respective metal lines will be formed are opened is formed on the second hard mask layer 134. Next, the second hard mask layer 134, the first hard mask layer 132, and the trench insulating layer 130 are etched using an etching process using the photoresist pattern until the etch barrier layer 128 is exposed. The etching process is preferably performed under a process condition in which a nitride layer is less etched than an oxide layer (that is, a process condition in which an etch selectivity is high for the nitride layer to the oxide layer). To this end, the etching process is preferably performed using a $C_4F_8$ gas or a $C_4F_6$ gas. Next, the photoresist pattern, the second hard mask layer 134, and the first hard mask layer 132 are removed.

Accordingly, damascene patterns, having a uniform depth and having the etch barrier layer 128 exposed therethrough, are formed in the trench insulating layer 130 of the first and second areas. Metal lines are formed in the respective damascene patterns. In particular, the metal lines must be connected to the second contact plugs 126 formed in the second area B. Accordingly, a process of removing the etch barrier layer 128 under the damascene patterns formed in the second area B is performed.

Figure 1E:
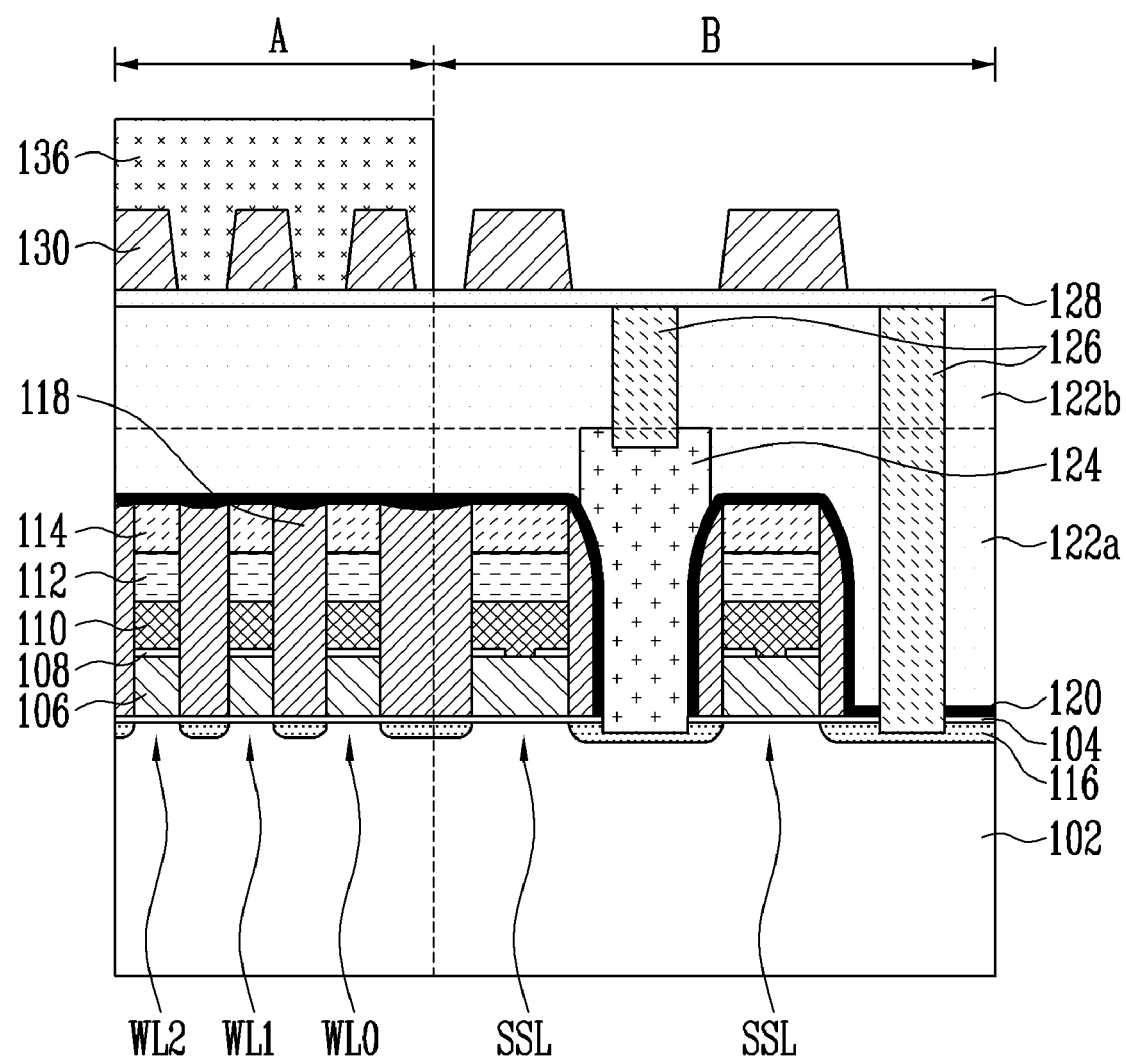

Referring to FIG. 1E, a mask layer 136 is formed on the etch barrier layer 128 and the trench insulating layer 130 of the first area A. The mask layer 136 is not formed in the second area B (that is, a region in which the contact plugs to be connected to metal lines are formed), thereby exposing the etch barrier layer 128 on the second contact plugs 126 formed in the second area B.

Figure 1F:
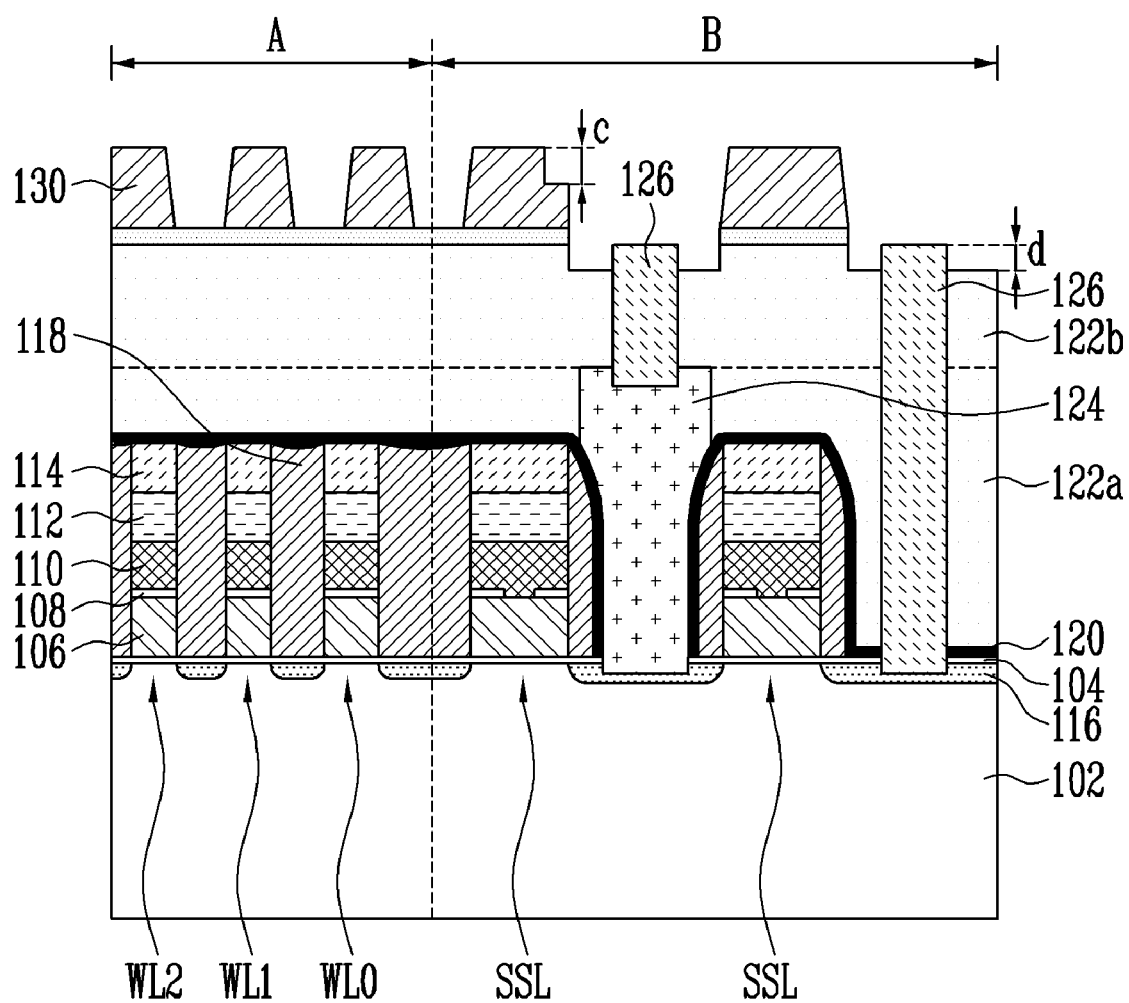

Referring to FIG. 1F, the etch barrier layer 128 formed on the second contact plugs 126 of the second area B is removed by performing an etching process using the mask layer 136. At this time, the damascene patterns of the second area B may be also partially removed. Accordingly, a step having a depth 'c' of 300 to 700 Å may be formed in the damascene patterns formed at the boundary of the first area A and the second area B. Further, on the lower side of the damascene patterns formed in the second area B, the trench insulating layer 130 under the etch barrier layer 128 may be removed at a depth 'd' of 200 to 300 Å.

Meanwhile, since the etch barrier layer 128 of the first area A is covered with the mask layer 136, the etch barrier layer 128 is not removed or removed to a thickness of less than 150 Å. As described above, while the etch barrier layer 128 of the second area B is removed, the etch barrier layer 128 of the first area A is not removed or may remain very little in the first area A. Accordingly, the damascene patterns formed in the first area A can have their original depths that are uniformly formed. Accordingly, metal lines formed in the damascene patterns of the first area A in a subsequent process have the same height, so a shift in the resistance according to the metal lines can be minimized.

This etching process may be preferably performed using any one of a $CF_4$ gas, a $CHF_3$ gas, and a $CH_2F_2$ gas or a mixed gas of two or more of them. The mask layer 136 is then removed.

Unlike the above description, the etch barrier layer of the first area A and the etch barrier layer 128 of the second area B can be removed at the same time without forming the mask layer 136 in the first area A. In order to fully remove the etch barrier layer 128 of the second area B, over etch has to be performed on the etch barrier layer 128. Accordingly, during the process of removing the etch barrier layer 128 of the second area B, the damascene patterns formed in the first area A are also over etched. In this case, it is difficult to control the damascene patterns of the first area A so that they are uniformly etched. Accordingly, the damascene patterns formed in the first area A may have a different depth. This results in a difference in the height of metal lines formed in the damascene patterns. Consequently, a shift in the resistance according to the metal lines increases and, therefore, the characteristics of semiconductor devices may be deteriorated.

In contrast, according to the present invention, since the etch barrier layer 128 of the second area B is removed without forming the mask layer 136 in the first area A, the damascene patterns formed in the first area A can have their original depths that are uniformly formed. Accordingly, since the metal lines formed in the damascene patterns of the first area A in a subsequent process have the same height, a shift in the resistance according to the metal lines can be minimized.

Further, according to the present invention, the metal lines formed in the damascene patterns of the first area A are formed in the trench insulating layer 130 having a lower capacitance than that of the etch barrier layer 128. Accordingly, capacitance between the metal lines can be decreased and RC delay can be improved. Consequently, the characteristics of semiconductor devices can be improved.

Meanwhile, as described above, the present invention has been described by taking flash memory of semiconductor devices as an example. However, the present invention can be applied to all manufacturing processes of semiconductor devices, including a process of forming an etch barrier layer for forming metal lines on contact plugs and a trench insulating layer in which damascene patterns are formed and removing the etch barrier layer on the contact plugs.

The embodiment disclosed herein has been proposed to allow a person skilled in the art to easily implement the present invention, and the person skilled in the part may implement the present invention in various ways. Therefore, the scope of the present invention is not limited by or to the embodiment as described above, and should be construed to be defined only by the appended claims and their equivalents.

What is claimed is:

1. A method of forming damascene patterns of semiconductor devices, the method comprising:
   providing a semiconductor substrate having a first area and a second area;
   forming a first insulating layer over the semiconductor substrate corresponding to the first area and the second area;
   forming contact plugs in the first insulating layer corresponding to the second area;
   forming an etch barrier layer and a second insulating layer over the first insulating layer corresponding to the first area and the second area;
   forming damascene patterns for metal lines from the second insulating layer corresponding to the first area and the second area;
   forming a mask layer over the second insulating layer corresponding to the first area except the second area so that the damascene patterns of the second area are exposed;
   removing the etch barrier layer of the second area by performing an etching process employing the mask layer to expose the contact plugs; and
   removing the mask layer.

2. The method of claim 1, wherein the etch barrier layer is formed of materials having an etch selectivity different from that of the second insulating layer.

3. The method of claim 1, wherein the etch barrier layer is formed from a nitride layer.

4. The method of claim 1, wherein the second insulating layer is formed from an oxide layer.

5. The method of claim 1, wherein the removal of the etch barrier layer is performed by using any one of a $CF_4$ gas, a $CHF_3$ gas, and a $CH_2F_2$ gas or a mixed gas of two or more of them.

6. The method of claim 1, wherein the etch barrier layer remains under the damascene patterns of the first area in which the contact plugs are not formed.

* * * * *